US007372140B2

(12) United States Patent
Lee

(10) Patent No.: US 7,372,140 B2
(45) Date of Patent: May 13, 2008

(54) MEMORY MODULE WITH DIFFERENT TYPES OF MULTI CHIP PACKAGES

(75) Inventor: Chang-Hwan Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 163 days.

(21) Appl. No.: 11/302,052

(22) Filed: Dec. 12, 2005

(65) Prior Publication Data

US 2006/0145337 A1 Jul. 6, 2006

(30) Foreign Application Priority Data

Jan. 5, 2005 (KR) ...................... 10-2005-0000810

(51) Int. Cl.
*H01L 23/02* (2006.01)

(52) U.S. Cl. ...................... 257/686; 257/685; 257/723; 257/777; 257/E25.006; 257/E25.013; 257/E25.021; 257/E25.027; 257/E23.085

(58) Field of Classification Search ................ 257/685, 257/686, 723, 777, E25.006, E25.013, E25.018, 257/E25.021, E23.085, E21.614; 438/109, 438/FOR. 365, FOR. 426

See application file for complete search history.

(56) References Cited

U.S. PATENT DOCUMENTS 6,545,868 B1 4/2003 Kledzik et al.

6,856,009 B2 * 2/2005 Bolken et al. .............. 257/686

FOREIGN PATENT DOCUMENTS

| | | |
|---|---|---|
| JP | 05-299616 | 11/1993 |
| JP | 2001-007278 | 1/2001 |
| KR | 2000-0008962 | 5/2000 |
| KR | 2004-0023486 | 3/2004 |

OTHER PUBLICATIONS

English language abstract of Korean Publication No. 2000-0008962.

English language abstract of Korean Publication No. 2004-0023486.

English language abstract of Japanese Publication No. 05-299616.

* cited by examiner

*Primary Examiner*—Jasmine Clark

(74) *Attorney, Agent, or Firm*—Marger Johnson & McCollom, P.C.

(57) ABSTRACT

In an embodiment, a memory module includes a first group of multi chip packages, including one or more non-volatile memories, and a second group of multi chip packages, including one or more volatile memories, wherein the first and second groups of multi chip packages are electrically connected to a substrate. Various types of memory packages can be integrated into a single module that is mounted to the substrate, such as a printed circuit board, for improved size efficiency.

11 Claims, 2 Drawing Sheets

MEMORY MODULE WITH DIFFERENT TYPES OF MULTI CHIP PACKAGES

CROSS-REFERENCE TO RELATED PATENT APPLICATION

This application claims the benefit of Korean Patent Application No. 10-2005-000810, filed on Jan. 5, 2005, in the Korean Intellectual Property Office, the disclosure of which is incorporated herein in its entirety by reference.

BACKGROUND OF THE INVENTION

1. Field of the Invention

The present invention relates to a semiconductor memory module, and more particularly, to a memory module with different kinds of multi chip packages capable of being used as a substitute for a hard disk and a memory in a small-size computer.

2. Description of the Related Art

FIGS. 1A and 1B are diagrams illustrating a general memory module. FIG. 1A is a top plan view of the general memory module, and FIG. 1B is a front view.

Referring to FIGS. 1A and 1B, in the general memory module, a single kind of memory chip 11 is mounted on a printed circuit board (PCB) 12. In the memory module, the memory chips 11 may be mounted on one or both surfaces of the PCB 12. Further, a memory 13 built inside each of the memory chips 11 may be a volatile memory such as a DRAM or an SRAM, or a non-volatile memory such as a NAND flash memory or a NOR flash memory.

Conventionally, only DRAM chips, SRAM chips, or flash memory-type chips are mounted to one memory module, because only a single kind of memory chip can be mounted to the memory module.

Regarding possible state-of-the-art, future, small-size computers, a hard disk drive (HDD) and a memory may necessarily not be separately installed, and a non-volatile memory may be used instead of a hard disk, for example. Further, in a portable computer, a non-volatile memory, which is robust against outside impact, is used instead of a hard disk for storing data because the hard disk is weak on impact.

Furthermore, there has been a trend to generally minimize portable computer sizes. Therefore, to minimize the volume of a small-size computer that is portable or used in a vehicle, it may be necessary to reduce the volume of the computer by integrating a standard memory and a hard-disk memory into a single memory module, for example.

SUMMARY

Embodiments of the present invention provide a memory module that may be used in a small-sized or portable computer, for example, by integrating several types of memories, such as a memory for a hard disk, a ROM, and a RAM.

An embodiment of the present invention also provides a memory module that may be used in for a hard disk in a small-size computer.

In one embodiment, a memory module comprises a first group of multi chip packages including one or more non-volatile memories; and a second group of multi chip packages including one or more volatile memories. The first and the second group of multi chip packages are electrically connected to a substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1A:
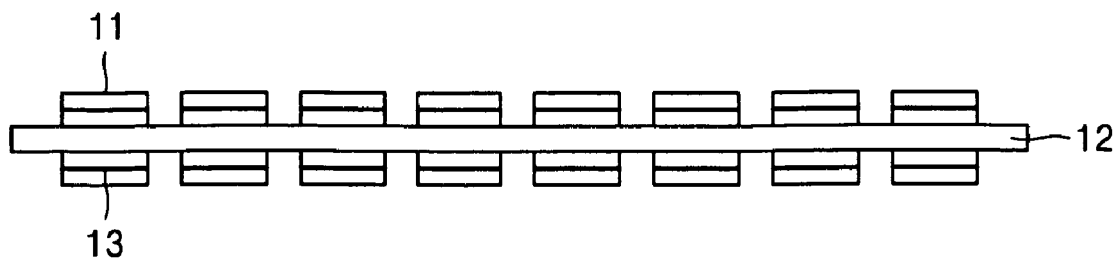
FIGS. 1A and 1B are diagrams illustrating a general memory module.
Figure 1B:
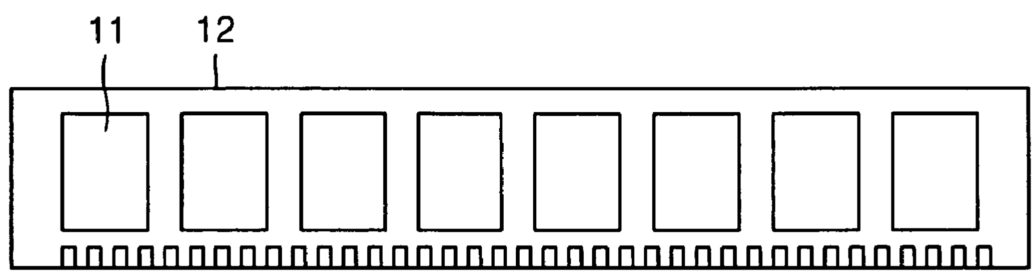

The present invention will now be described more fully with reference to the accompanying drawings, in which exemplary embodiments of the present invention are shown. Like reference numerals in the drawings denote like elements.

Figure 2:
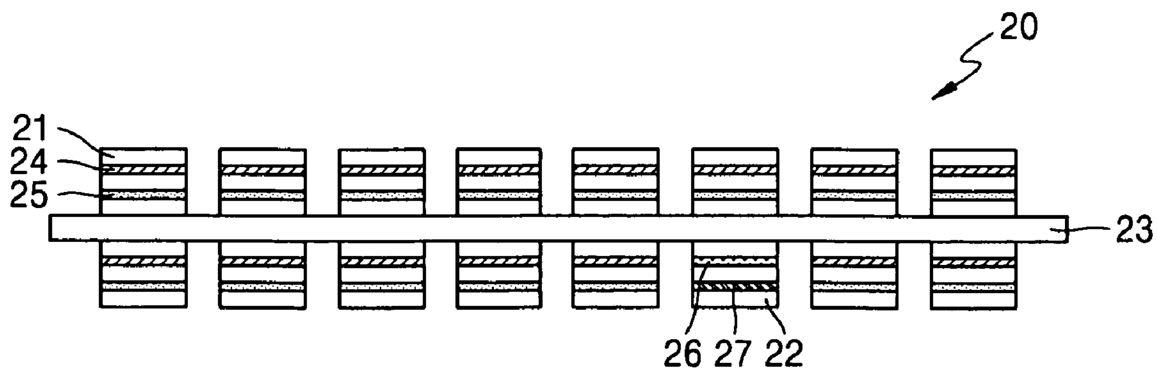
FIG. 2 is a diagram illustrating a memory module according to an embodiment of the present invention.

FIG. 2 is a diagram illustrating a memory module according to an embodiment of the present invention.

In a memory module 20, according to the present invention, different kinds of multi chip packages (MCP) are mounted on a PCB 23. One kind of MCP is a multi chip package 21 that includes a NAND type flash memory 24 and a NOR type flash memory 25. Another kind of multi chip package is a multi chip package 22 that includes a DRAM 26 and a Unit transistor RAM (UtRAM) 27. These are just a few examples of the possible combinations of packages that are among the embodiments of the invention.

Figure 3:
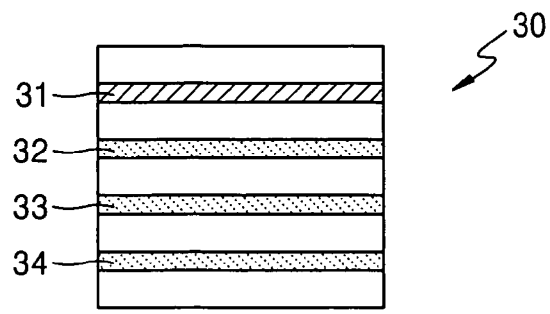
FIG. 3 is a diagram illustrating an embodiment in which a volatile memory and a non-volatile memory are included in one multi chip package.

In an embodiment, according to the present invention shown in FIG. 2, one kind of multi chip package 21 is a multi chip package consisting of only a non-volatile memory. Another kind of multi chip package 22 is a multi chip package consisting of only a volatile memory. However, in an embodiment according to the present invention, both a volatile memory and a non-volatile memory may be included in one multi chip package. FIG. 3 shows an embodiment in which a volatile memory and a non-volatile memory are included in one multi chip package. In the embodiment shown in FIG. 3, three flash memories 32, 33, 34, and one DRAM 31 are included in one multi chip package 30.

That is, the memory module shown in FIG. 2 may be composed of a first group of multi chip packages consisting of non-volatile memories and a second group of multi chip packages consisting of volatile memories, or a third group of multi chip packages in which non-volatile memories and volatile memories are combined. Further, a memory module according to another embodiment of the present invention may be composed of the first group of multi chip packages and the third group of multi chip packages.

The memory module 20 shown in FIG. 2 includes both a non-volatile memory and a volatile memory in one memory module, and can be used in a portable computer, for example. That is, the non-volatile memory and the volatile memory in the memory module 20 can serve as a hard disk, a ROM, and a RAM, respectively. In this way, functions of the hard disk and the ROM can be integrated in one memory module, so that a computer having the integrated memory module can have a remarkably reduced volume while able to sufficiently endure any outside impact. It is noteworthy to compare this to a conventional computer having a separate hard disk and ROM.

Specifically, a portable computer may be enabled to be minimized to the extent that it can evolve into a watch-type computer, with functions of a hard-disk, a ROM, and a RAM all integrated into a memory module, according to an embodiment of the present invention.

Figure 4:
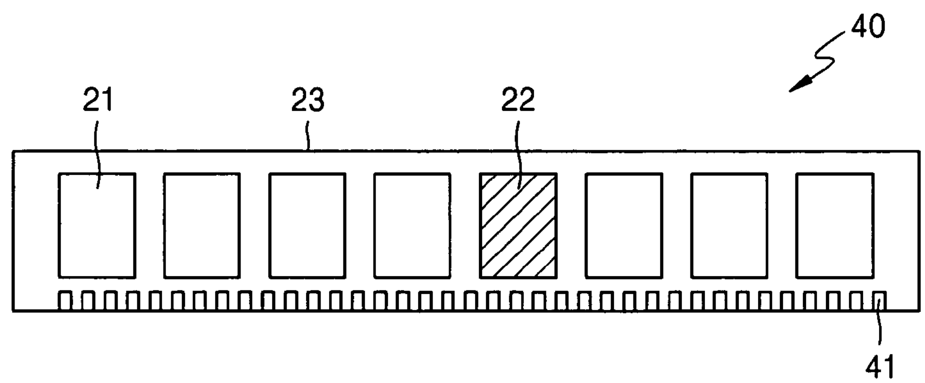
FIG. 4 is a diagram illustrating an embodiment of a data signal line in the memory module shown in FIG. 2.

FIG. 4 shows an embodiment of a data signal line in a memory module 40 such as that shown in FIG. 2. In the memory module 40, a data signal line is shared by a volatile memory, for example a DRAM or a UtRAM, mounted in the memory module 40, and a non-volatile memory, for example a NAND flash or a NOR flash.

That is, in the memory module 40, data is input to, or output, from the volatile memory and the non-volatile memory through a data input/output connection pin 41. Further, in the memory module 40, a power supply line and a clock signal line may be shared.

Figure 5:
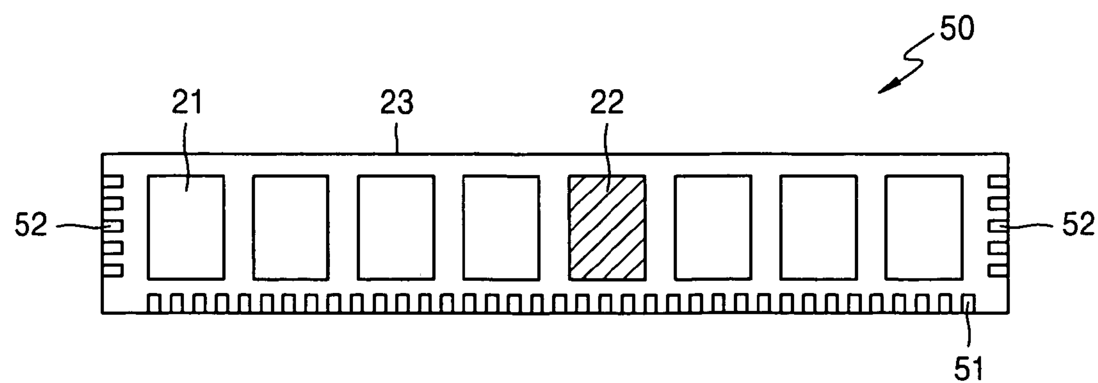
FIG. 5 is a diagram illustrating another embodiment of the data signal line in the memory module shown in FIG. 2.

FIG. 5 shows another embodiment of a data signal line in a memory module 50 such as that shown in FIG. 2. In the memory module 50, data signal lines of a volatile memory (DRAM or UtRAM) and a non-volatile memory (NAND flash or NOR flash) mounted in the memory module 50 are different from each other. In the memory module according to this embodiment of the present invention, an input/output data line of the non-volatile memory is a relatively small number and has different input/output characteristics than those of other RAM's, and a separate data signal may be used for these different memory types. A data signal line connected to a volatile memory shown in FIG. 5 uses an input/output connection pin 51 formed on a lower part of the memory module 50, and a data signal line connected to a non-volatile memory uses an input/output connection pin 52 formed on right and/or left sides of the memory module 50. Further, the memory module 50 may separately use a power supply line and a clock signal line, as well as a data signal line.

Specifically, it may be most effective if the non-volatile memory and the volatile memory use an independent power supply voltage because a level of a power supply voltage used in a flash memory is different from that of a power supply voltage used in a DRAM or a UtRAM, for example.

According to a semiconductor memory module of the present invention, it is possible to use the integrated memory in a small-size computer by integrating the memories of a hard disk, a ROM, and a RAM, for example.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory module comprising:

a first group of multi chip packages including one or more non-volatile memories; and a second group of multi chip packages including one or more volatile memories, wherein the first and the second group of multi chip packages are electrically connected to a substrate; and wherein at least one of data signal lines, power supply lines, and clock signal lines of a volatile memory mounted in the memory module is different from that of a non-volatile memory mounted in the memory module.

2. The memory module according to claim 1, further comprising a third group of multi chip packages including one or more non-volatile memories and one or more volatile memories.

3. The memory module according to claim 1, wherein the first group of multi chip packages includes one or more NAND flash memories and one or more NOR flash memories.

4. The memory module according to claim 1, wherein the second group of multi chip packages includes one or more DRAM memories and one or more SRAM or UtRAM memories.

5. The memory module according to claim 2, wherein the third group of multi chip packages includes one or more flash memories and one or more DRAM memories.

6. The memory module according to claim 1, wherein the first and second groups of multi chip packages have a separately independent data input/output line, respectively.

7. The memory module according to claim 2, wherein the first, second, third groups of multi chip packages have a separate data input/output line, respectively.

8. The memory module according to claim 1, wherein the first and second groups of multi chip packages have a separate power supply line, respectively.

9. The memory module according to claim 2, wherein the first, second, and third groups of multi chip packages have a separate power supply line, respectively.

10. The memory module according to claim 1, which is used as a data storage device for a small-size computer, wherein the non-volatile memory serves as a ROM and a hard-disk.

11. The memory module according to claim 2, which is used as a data storage device for a small-size computer, wherein the non-volatile memory serves as a ROM and a hard-disk.

* * * * *